(12) United States Patent
Hwang et al.

(10) Patent No.: US 10,312,180 B2
(45) Date of Patent: Jun. 4, 2019

(54) WATER-COOLING THERMAL DISSIPATING SYSTEM AND THERMAL DISSIPATING METHOD

(71) Applicant: ENERMAX TECHNOLOGY CORPORATION, Taoyuan (TW)

(72) Inventors: Jer-Sheng Hwang, Taoyuan (TW); Teng-Kai Chang, Taoyuan (TW); Chin-Chen Chu, Taoyuan (TW)

(73) Assignee: Enermax Technology Corporation, Taoyuan, Taoyuan County (TW)

( * ) Notice: Subject to any disclaimer, the term of this patent is extended or adjusted under 35 U.S.C. 154(b) by 8 days.

(21) Appl. No.: 15/621,234

(22) Filed: Jun. 13, 2017

(65) Prior Publication Data
US 2017/0278773 A1  Sep. 28, 2017

Related U.S. Application Data

(63) Continuation-in-part of application No. 13/845,729, filed on Mar. 18, 2013, now abandoned.

(30) Foreign Application Priority Data

Apr. 23, 2012 (TW) .............................. 101114395 A

(51) Int. Cl.
*G06F 9/44* (2018.01)
*H01L 23/473* (2006.01)
(Continued)

(52) U.S. Cl.
CPC ....... *H01L 23/473* (2013.01); *B60H 1/00885* (2013.01); *G05D 23/306* (2013.01);
(Continued)

(58) Field of Classification Search
CPC .............. H01L 23/473; B60H 1/00885; G05D 23/306; H05K 7/20209; H05K 7/20781;
(Continued)

(56) References Cited

U.S. PATENT DOCUMENTS 5,594,893 A    1/1997  Byers et al.
6,157,244 A   12/2000  Lee et al.
(Continued)

FOREIGN PATENT DOCUMENTS

CN    101826248 A    9/2010

OTHER PUBLICATIONS

Overclock, how to install temp sensor, 2010 (Year: 2010).*
Tomshardware, monitoring water temperature, 2006 (Year: 2006).*

*Primary Examiner* — Anna C Deng
(74) *Attorney, Agent, or Firm* — Muncy, Geissler, Olds & Lowe, P.C.

(57) ABSTRACT

A water-cooling thermal dissipating system includes an electronic device and a thermal dissipating device. The electronic device includes a computing module includes a computing unit releasing heat when operation. The thermal dissipating device includes a thermal conducting unit, a pump, a tank, a thermal exchanger, and a controlling module; the thermal conductive unit is attached to the computing unit for thermal conduction; the pump is coupled to the thermal conductive unit, the pump, the tank, and the thermal exchanger for pumping a cooling-liquid therethrough, such that the cooling liquid is allowed to flow into the thermal conductive unit for absorbing heat. The controlling module generates an abnormal signal when the thermal dissipating device is sensed to be in an abnormal state, and the computing module forces to shut down the electronic device after continually receiving the abnormal signal for a predetermined time.

13 Claims, 6 Drawing Sheets

(51) Int. Cl.
   *B60H 1/00* (2006.01)
   *H05K 7/20* (2006.01)
   *G05D 23/30* (2006.01)
   *G06F 1/20* (2006.01)
   *F04D 29/42* (2006.01)

(52) U.S. Cl.
   CPC ......... *G06F 1/206* (2013.01); *H05K 7/20209* (2013.01); *H05K 7/20281* (2013.01); *B60H 1/00457* (2013.01); *F04D 29/4226* (2013.01); *G06F 2200/201* (2013.01)

(58) Field of Classification Search
   CPC ............... G06D 1/206; F04D 29/4226; B06H 1/00457; G06F 2200/201
   USPC ......................................................... 717/168
   See application file for complete search history.

(56) References Cited

U.S. PATENT DOCUMENTS 6,487,463 B1 * 11/2002 Stepp, III ........... G05D 23/1934
                                                          700/299
   6,658,861 B1    12/2003 Ghoshal et al.
   7,436,666 B1 * 10/2008 Konshak .................. G06F 1/20
                                                          165/104.33
   2003/0174467 A1    9/2003 Lu
   2004/0027801 A1 *  2/2004 Nakagawa ............ G06F 1/1601
                                                          361/679.53
   2004/0132398 A1 *  7/2004 Sharp ................. H05K 7/20609
                                                          454/184
   2004/0268163 A1   12/2004 Yeh
   2005/0060122 A1    3/2005 Lin et al.
   2006/0037331 A1    2/2006 Nicolai et al.
   2006/0095797 A1 *  5/2006 Hung .................... G06F 1/3203
                                                          713/300
   2008/0077282 A1 *  3/2008 Hartman ................ G06F 1/206
                                                          700/300
   2009/0178783 A1 *  7/2009 Lin ........................ G06F 1/203
                                                          165/80.4
   2009/0268404 A1 * 10/2009 Chu .................... H05K 7/20745
                                                          361/696
   2010/0236772 A1 *  9/2010 Novotny ............. H05K 7/2079
                                                          165/287
   2010/0290190 A1 * 11/2010 Chester .............. H05K 7/20772
                                                          361/701
   2011/0132579 A1    6/2011 Best et al.
   2011/0290448 A1 * 12/2011 Campbell ............. F28D 1/0471
                                                          165/104.13
   2012/0035773 A1 *  2/2012 Stabinski .............. F25B 49/025
                                                          700/282
   2012/0038413 A1 *  2/2012 Lin ...................... G09G 3/3696
                                                          327/518
   2013/0073096 A1    3/2013 Brey et al.
   2013/0098593 A1    4/2013 Busch et al.
   2013/0233532 A1    9/2013 Imwalle et al.

* cited by examiner

WATER-COOLING THERMAL DISSIPATING SYSTEM AND THERMAL DISSIPATING METHOD

CROSS REFERENCE

This application is a Continuation-in-Part of co-pending application Ser. No. 13/845,729, filed on Mar. 18, 2013, for which priority is claimed under 35 U.S.C. § 120; and this application claims priority of Application No. 101114395 filed in Taiwan on Apr. 23, 2012 under 35 U.S.C. § 119; the entire contents of all of which are hereby incorporated by reference.

BACKGROUND

Technical Field

The present disclosure relates to a thermal dissipating system, and in particular to a water-cooling thermal dissipating system and a thermal dissipating method Description of Related Art Computer application and people's life are inseparable because the improvement of word-processing ability of computer and software, and more and more students and office workers completely prearranged work and entertainment by computer.

The integrated circuits (ICs) disposed within the computer become smaller and small, however, the heat generated by the operating ICs become higher and higher, especially the heat generated by the central processing unit (CPU) is the highest so as to increase the temperatures around the CPU. The high temperature environment operation will slower the operating speed of the ICs, and is a main reason for damaging the ICs.

In order to solve the problem mentioned above, a part of manufacturers use heat tanks, fans and water-cooling thermal dissipating system to collectively conducted heat. However, conventional water-cooling thermal dissipating system cannot communicate with software installed in the computer or warn user when unusual operation or damage. Such that the water-cooling thermal dissipating system is damaged or even blasting because user cannot instantaneously close a part of operated programs or enhance thermal dissipating ability of the water-cooling thermal dissipating system, and then the computer is consequentially damaged.

SUMMARY

It is an object to provide a water-cooling thermal dissipating system includes an electronic device and a thermal dissipating device. The electronic device includes a computing module, a power supply unit, and a display unit. The computing module includes a computing unit releasing heat when operation; the power supply unit is electrically connected to the computing module and configured to supply an electricity to the computing module; and the display unit is electrically connected to the computing module. The thermal dissipating device includes a thermal conducting unit, a pump, a tank, a thermal exchanger, a controlling module, and a cable; the thermal conductive unit is disposed corresponding to the computing unit and attached to an external surface of the thermal conductive unit for thermal conduction; the pump is coupled to the thermal conductive unit for pumping a cooling-liquid into the thermal conductive unit; the tank is coupled to the pump, wherein the cooling-liquid is storage in the tank; the thermal exchanger is coupled to the thermal conductive unit and the tank, wherein the cooling liquid is allowed to flow into the thermal conductive unit for absorbing heat produced by the computing unit, and the thermal exchanger then thermally transfers heat within the cooling liquid to the external environment for dispersing heat; the controlling module is configured to sense a working state and control heat dissipation efficiency of the thermal dissipating device; and the cable is connected to the computing module and the controlling module, wherein the computing module and the controlling module are electrically connected to each other through the cable. An abnormal signal is generated and send to the computing module through the cable by the controlling module when the thermal dissipating device is sensed to be in an abnormal state by the controlling module, the computing module then makes the display unit show alarm information to inform users and forces to shut down the electronic device after continually receiving the abnormal signal for a predetermined time.

It is another object to provide a thermal dissipating method for a thermal dissipating device coupled to an electronic device, the thermal dissipating method includes the following steps: sensing if a thermal dissipating device is in an abnormal state; generating an abnormal signal when the thermal dissipating device is in an abnormal state; and forcing to shut down the electronic device after continually receiving the abnormal signal for a predetermined time.

BRIEF DESCRIPTION OF DRAWING

The present disclosure can be more fully understood by reading the following detailed description of the embodiment, with reference made to the accompanying drawings as follows.

DETAILED DESCRIPTION

A preferred embodiment of the present disclosure will be described with reference to the drawings.

Figure 1:
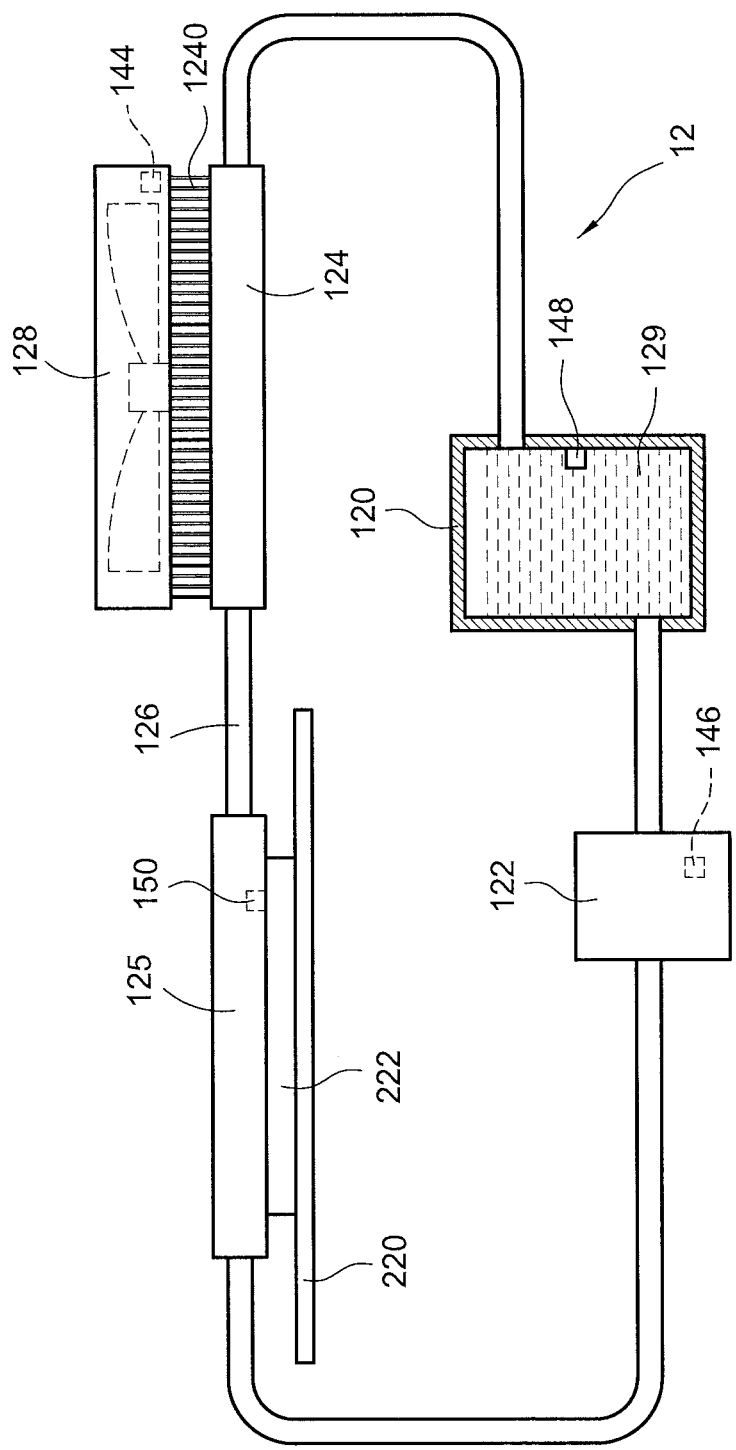
FIG. 1 is a schematic view of a water-cooling thermal dissipating system according to the present disclosure.
Figure 2A:
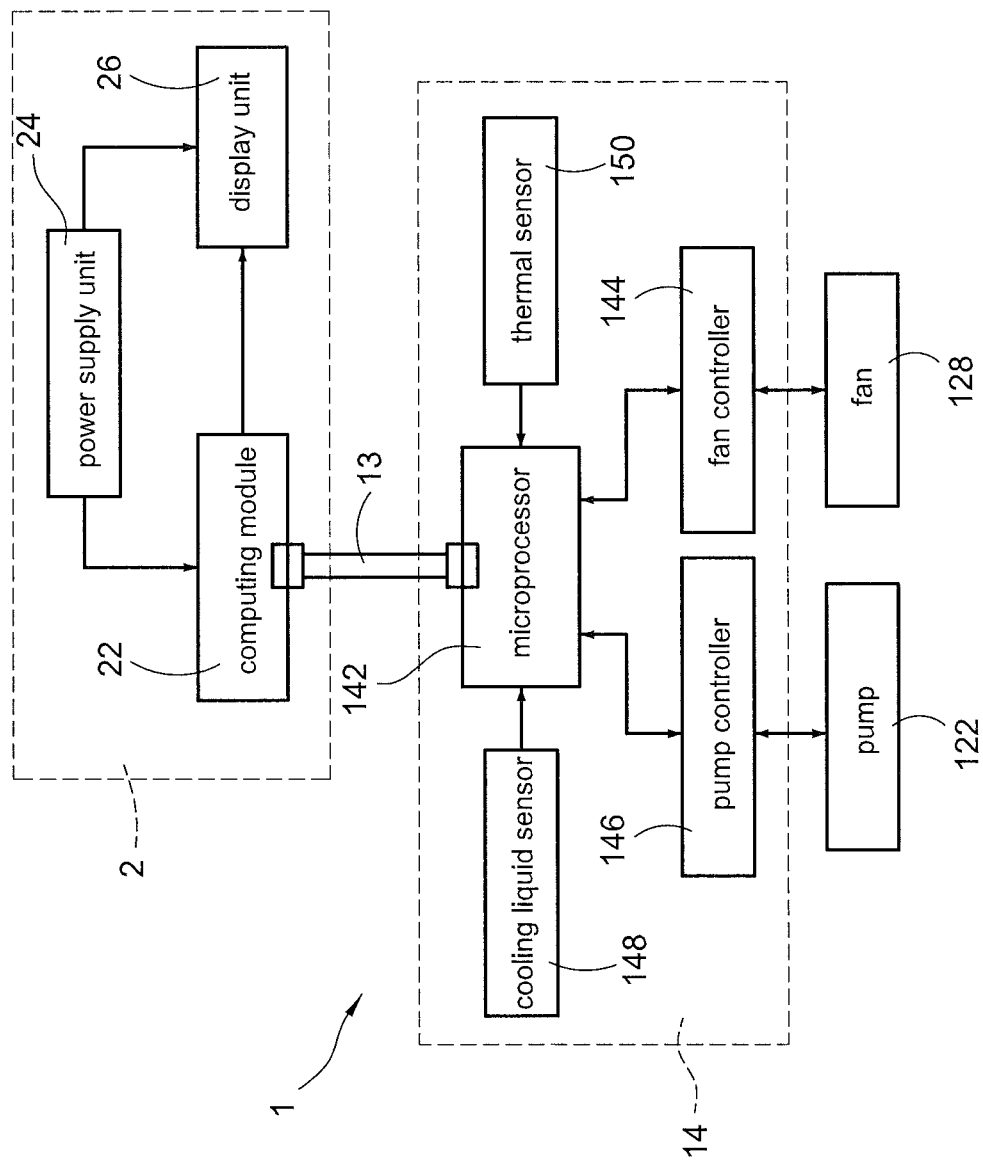
FIG. 2A is a circuit block diagram of the water-cooling thermal dissipating system according to a 1st embodiment of the present disclosure.

FIG. 1 is a schematic view of a water-cooling thermal dissipating system according to a 1st embodiment of the present disclosure, and FIG. 2A is a circuit block diagram of the water-cooling thermal dissipating system according to the 1st embodiment of the present disclosure. In FIG. 1 and FIG. 2A, the water-cooling thermal dissipating system (its reference numeral is omitted) includes a thermal dissipating device 1 and an electronic device 2, and the thermal dissipating device 1 is used for conducting heat released from the electronic device 2 to prevent the electronic device 2 from operating under high temperature which increases unstable operating of modules and units installed in the electronic device 2 or even damages the electronic device 2. The electronic device 2 is, for example, a computer capable of being placed on a desktop or a portable computer.

The electronic device 2 includes a computing module 22, a power supply unit 24, and a displaying unit 26; the computing module 22 includes a motherboard 220 and a computing unit 222 mounted on the motherboard 220. The computing unit 222 generates dramatic quantities of heat when operation. The power supply unit 24 is electrically connected to the computing module 22 and provides the electricity 240 to the computing module 22 and the display unit 26.

Figure 2B:
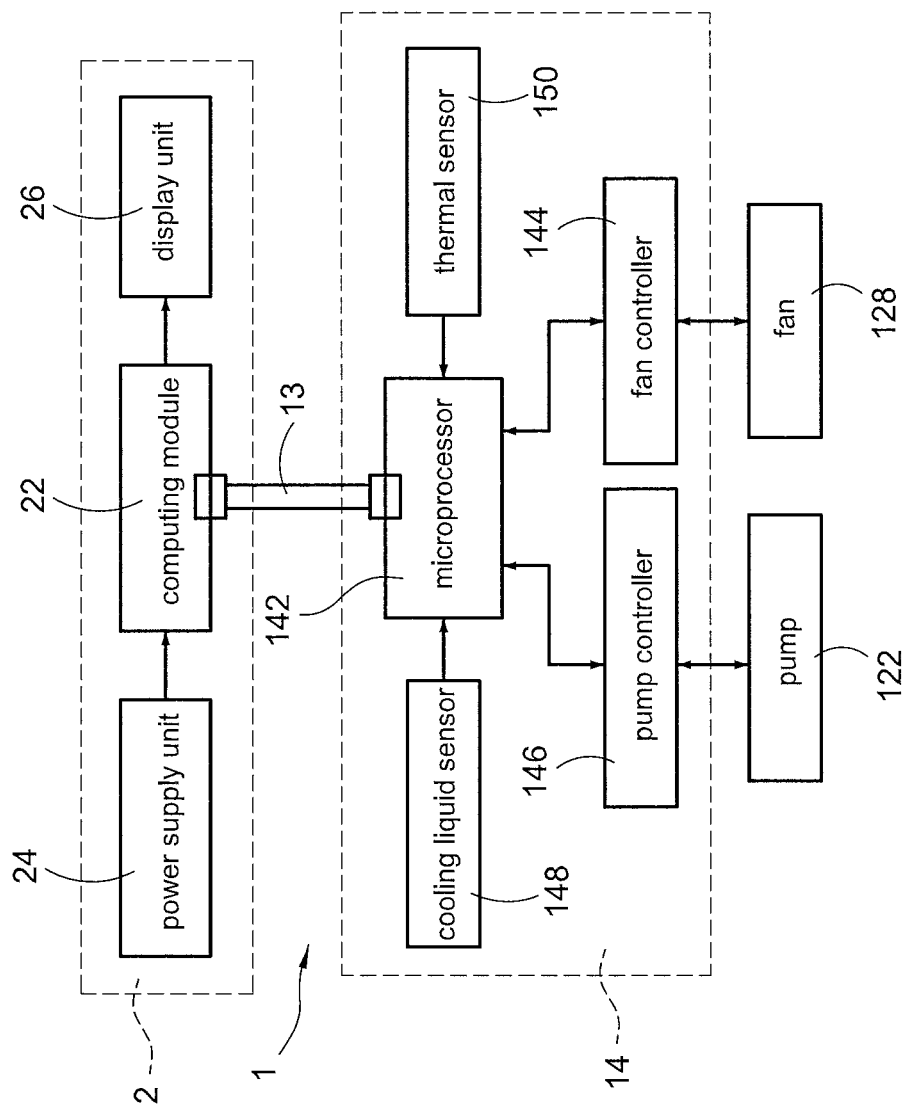
FIG. 2B is a circuit block diagram of water-cooling thermal dissipating system according to the 2nd embodiment of the present disclosure.

The displaying unit 26, which displays pertinent information, is electrically connected to the computing module 22. In addition, the display unit 26 is utilized to display abnormal status of the thermal dissipating device 1, thereby allowing a user to easily understand operation status of the thermal dissipating device 1, and thus enabling real time elimination of possible damage, and lowing of probability malfunction. The display unit 26 may receive electricity directly through the power supply unit 24 (as shown in FIG. 2A). The display unit 26 may alternatively receive electricity directly through the computing module 22 that receives electricity from the power supply unit 24 (as shown in FIG. 2B). The displaying unit 26 may include a liquid crystal display (LCD) panel, an organic light emitting diode (OLED) panel or a plasma display panel (PDP).

With referred again to FIG. 2A; the thermal dissipating device 1 may be installed into or apart from the electronic device 2. The thermal dissipating device 1 includes a thermal-cycling loop 12, a cable 13, and a controlling module 14 configured to sense a working state and control heat dissipation efficiency of the thermal dissipating device 1. The thermal-cycling loop 12 includes a tank 120, a pump 122, a thermal exchanger 124, and a thermal conductive unit 125. The pump 122 is coupled to the tank 120, the thermal exchanger 124, and the thermal conductive unit 125 via a plurality of pipes 126 and utilized to circulate a cooling liquid 129 (such as water) to cool the computing unit 222 attached to the thermal conductive unit 125. Specifically, the thermal conductive unit 125 is disposed corresponding to the computing unit 222, and the computing unit 222 is in contact with an external surface of the thermal conductive unit 222, such that thermal conduction is implemented between the computing unit 222 and the thermal conductive unit 125.

The cooling liquid 129 is stored in the tank 120, and is forced to flow within the pipes 126 by the pump 122; the cooling liquid 129 will absorb heat generated by the computing unit 222 and thermally conducted to the thermal conductive unit 125 when flows into the thermal conductive unit 125.

The thermal exchanger 124 thermally transfers heat within the cooling liquid 129 to the external environment for dispersing heat. The thermal dissipating device 1 may further include a plurality of fins 1240 attached to the thermal exchanger 124; the fins 1240 may help providing additional thermal transfer area to the thermal exchanger 124. The thermal dissipating device 1 may still further include a fan 128 placed at the thermal exchanger 124 to provide an air flow in the thermal exchanger 124 for rapidly dissipating heat to the external environment.

With referred again to FIG. 2A; the computing module 22 and the controlling module 14 are electrically connected to each other by the cable 13, such that the electricity generated by the power supply unit 24 can be conducted to the controlling module 14 for powering the controlling module 14, and signals outputted from the controlling module 14 can be transmitted to the computing module 22. In this embodiment, the cable 13 may be a universal series bus (USB) cable has a USB connector connected with a USB port of the electronic device 2.

The controlling module 14 configured to sense the working state and control heat dissipation efficiency of the thermal dissipating device 1 includes a microprocessor 142, a fan controller 144, a pump controller 146, a cooling liquid sensor 148, and a thermal sensor 150, and the microprocessor 142 is electrically connected to the computing module 22 by the cable 13.

Please refer to both FIG. 1 and FIG. 2A along with the following disclosed content. The fan controller 144 is electrically connected to the microprocessor 142 and the fan 128 and configured to control a rotating speed of the fan 128 (hereafter "the fan speed"). Specifically, the fan controller 144 may generate a fan speed control signal to the fan 128 in accordance with one or more temperatures of the thermal conductive unit 125, the cooling liquid 129 (in the tank 120), and the external environment; the fan speed control signal is, for example, a pulse width modulated signal, and the fan speed is determined according to changes in the duty cycle of the pulse width modulated signal.

The fan controller 144 is further configured to sense the fan speed and outputs a fan speed abnormal signal to the microprocessor 142 when the fan speed is abnormal (such as the actual fan speed is not within the range of the normal speed). The microprocessor 142 outputs the fan speed abnormal signal to the computing module 22 via the cable 13 when it receives the fan speed abnormal signal. The computing module 22 makes the display unit 26 show alarm information to indicate that the fan 128 is not rotating under the normal speed when it receives the fan speed abnormal signal. Therefore, user can decide whether to continually use the electronic device 2.

The pump controller 146 is electrically connected to the microprocessor 142 and the pump 122 and configured to control a rotating speed of the pump 122 (hereafter "the pump speed"), thus a flowing rate of the cooling liquid 129 is controlled. More particularly, the pump controller 146 may generate a pump speed control signal to the pump 122 in accordance with one or more temperatures of the thermal conductive unit 125, the cooling liquid 129, and the external environment to change pump speed.

The pump controller 146 is further configured to sense the pump speed and outputs a pump speed abnormal signal to the microprocessor 142 when the pump speed is abnormal (such as the actual pump speed is not within the range of the normal speed). The microprocessor 142 outputs the pump speed abnormal signal to the computing module 22 via the cable 13 when it receives the pump speed abnormal signal, and the computing module 22 makes the display unit 26 show alarm information to indicate that the pump 122 is not rotated under the normal speed when it receives the pump speed abnormal signal. Therefore, user can decide whether to continually use the electronic device 2.

The cooling liquid sensor 148 may be disposed within the tank 124 and electrically connected to the microprocessor 142. The cooling liquid sensor 148 is configured to sense an operating temperature of the cooling liquid 129 in the tank 120 and output a liquid temperature warming signal to the microprocessor 142 when the temperature of the cooling liquid 129 in the tank 100 is over-heat (such as higher than a safe operation temperature (for example, 50 degrees Celsius)). The microprocessor 142 outputs the liquid temperature warming signal to the computing module 22 via the cable 13 when it receives the liquid temperature warming signal, and the computing module 22 makes the display unit 26 show warning information to indicate that the cooling liquid 129 is over-heat. Therefore, user can shut down the electronic device 2 or enhance thermal dissipating effect of the thermal dissipating device 1 by manually or automatically increase the fan speed and/or pump speed until the fan speed or pump speed is not within the range of the normal speed (such as reaches a maximum speed).

The cooling liquid sensor 148 may further sense a level of the cooling liquid 129 and output a level abnormal signal to the microprocessor 142 when the actual level of the cooling liquid 129 in the tank 120 is sensed as a low liquid level. The microprocessor 142 outputs the level abnormal signal to the computing module 22 via the cable 13 when it receives the level abnormal signal. The computing module 22 makes the display unit 26 show alarm information to indicate that the cooling liquid 129 is at a low liquid level and the electronic device 2 will be forced to shut down and forces to shut down the electronic device 2 after continually receiving the level abnormal signal for a predetermined time.

The thermal sensor 150 connected to the microprocessor 142 may be place near to the computing unit 222 (such as attached to an internal surface of the thermal conductive unit 125 in contacted with the computing unit 222). The thermal sensor 150 is configured to sense a working temperature of the computing unit 220 and will output a computing unit warning signal to the microprocessor 142 when the working temperature of the computing unit 222 is in over-heat status (i.e., the working temperature is not in a range retaining the thermal stability and life of the computing unit 222). The microprocessor 142 outputs the warming signal to the computing module 22 via the cable 13 when it receives the computing unit warning signal. The computing module 22 makes the display unit 26 show warning information to indicate that the computing unit 222 is in the over-heat status. Therefore, user may shut down the electronic device 2 or enhance thermal dissipating effect of the thermal dissipating device 1 by manually or automatically increase the fan speed and/or pump speed; the display unit 26 will stop showing the warning information mentioned above if the working temperature decreases to be in the range retaining the thermal stability and life of the computing unit 222.

Figure 3:
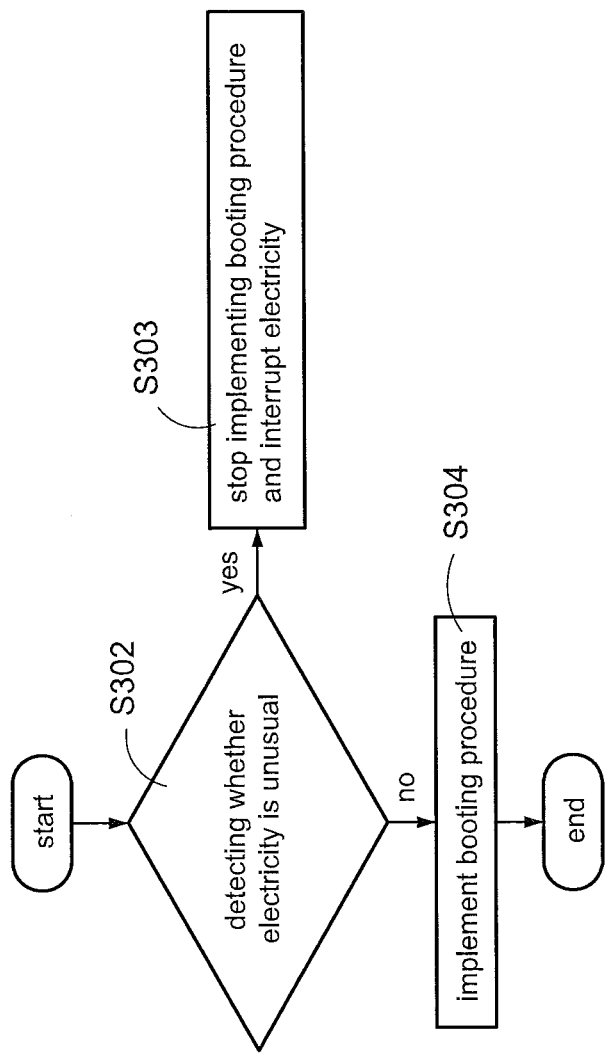
FIG. 3 is a flowchart showing steps for booting an electronic device according to the present disclosure.

Reference is made to FIG. 3, which is a flowchart showing steps for booting an electronic device according to the present disclosure. At first, the power supply unit 24 of the electronic device 2 implements procedure of electricity correction when the user presses a button for booting an electronic device 2 having the thermal dissipating device 1. In step S302, a correction is made as to whether the power supply unit 24 is unusual. When the power supply unit 24 is usual, the electricity is generated and transmitted to the computing module 22 (and the display unit 26) to implement booting procedure of the electronic device 2 (step S304), and when the power supply unit 24 is unusual, the booting procedure is stopped implementing and the electricity is interrupted (step S303). In particularly, the booting procedure of the electronic device 2 is the same as that of in currently and is not repeated here.

Figure 4:
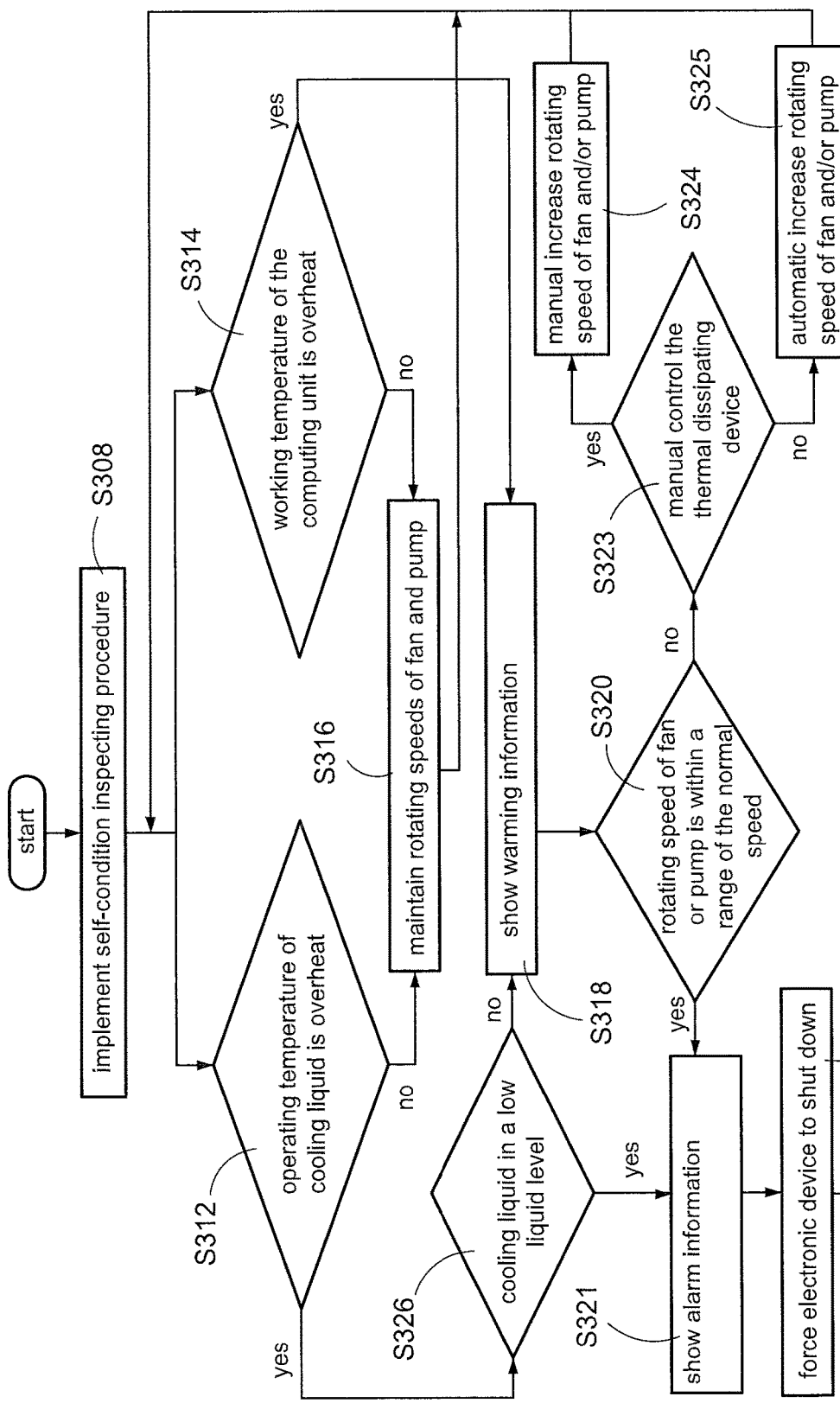
FIG. 4 is a flowchart showing steps for a thermal dissipating method of the water-cooling thermal dissipating system according to the present disclosure.

Reference is made to FIG. 4, which is a flowchart showing steps for thermal dissipating method of the thermal dissipating device according to the present disclosure. When the booting procedure of the electronic device 2 (step S304) is completely implemented, a self-condition inspecting procedure (step S308) is then implemented. The purpose of the self-condition inspecting procedure is made to whether the thermal-cycling loop 12 is unusual, namely, to whether the pump 122, the fan 128 and the cooling liquid 129 is unusual to prevent the thermal dissipating device 1 from breakdown.

After implementing the self-condition inspection, a cooling monitoring procedure is then implemented. The cooling monitoring procedure includes: at first, the controlling module 14 senses whether the operating temperature of the cooling liquid 129 in the tank 120 is over-heat via the cooling liquid sensor 128 (step S312), and the controlling module 14 senses whether the working temperature of the computing unit 222 is over-heat (step S314).

After step S312, when the temperature of the cooling liquid 129 is not over-heat, the rotating speeds of the fan 128 and the pump 122 are maintained (step S316), and then back to step S312 to implement cooling monitoring procedure. After step S314, when the working temperature of the computing unit 222 is not overheat, the rotating speeds of the fan 128 and the pump 122 is maintained (step S316), and back to step S314 to implement cooling monitoring procedure.

After step S312, when the temperature of the cooling liquid 129 is over-heat, and after step S314, when the working temperature of the computing unit 222 is over-heat, the cooling liquid sensor 148 senses whether the level of the cooling liquid 129 is in a low liquid level (step S326).

After step S326, when the level of the cooling liquid 129 is as a low liquid level, a level abnormal signal is generated by the cooling liquid sensor 148 and transmitted to computing module 22. The computing module 22 makes the displaying unit 26 show alarm information to indicate that the cooling liquid 129 is at a low liquid level and the electronic device 2 will be forced to shut down (step S321). The computing module 22 further forces to shut down the electronic device 2 after continually receiving the level abnormal for a predetermined time (such as 30 seconds) (step S322). After step S326, when the cooling liquid 129 is not as a low liquid level, a liquid temperature warming signal is generated by the cooling liquid sensor 145. The liquid temperature warming signal is transmitted to the computing module 22 and the computing module 22 makes the displaying unit 26 show warning information to indicate that the cooling liquid 129 is over-heat (step S318) and goes through the step S320.

In step S320, the fan controller 144 senses whether the rotating speed of the fan 128 is within a range of the normal speed (such as 2400 RPM), and the pump controller 146 senses whether the rotating speed of the pump 122 is within a range of the normal speed (such as 4500 rpm).

After step S320, when the rotating speed of the fan 128 exceeds the range of the normal speed, a fan speed abnormal signal generated by the fan controller 144 is transmitted to the computing module 22, and then the computing module 22 makes the displaying unit 26 show the alarm information to indicated that the fan 128 is not within a range of the normal speed and the electronic device 2 will be forced to shut down (step S321), and forces to shut down the electronic device 2 after continually receiving the fan speed abnormal signal for a predetermined time (step S322).

After step S320, when the rotating speed of the pump 122 exceeds the range of the normal speed, a pump speed abnormal signal generated by the pump controller 146 is transmitted to the computing module 22. The computing module 22 makes the displaying unit 26 show the alarm information to indicated that the pump 122 is not within a range of the normal speed and the electronic device 2 will be forced to shut down (step S321), and forces to shut down the electronic device 2 after continually receiving the pump speed abnormal signal for a predetermined time (step S322). After step S320, when the rotating speed of the fan 128 and the pump 122 are within the range of the normal speed, user can select whether to manual control the thermal dissipating device 1 (step S323).

When user selects to manual control to thermal dissipating device 1, controlling commands can be inputted by the electronic device 2 to increase rotating speeds of the fan 128 and/or the pump 122 (step S324), such that the thermal dissipating ability of the thermal dissipating device 1 can be enhanced. After that, back to the step S312 and step S314 to implement cooling monitoring procedure.

After step S323, when user does not select to manual control the thermal dissipating device 1, the microprocessor 142 automatic regulates the rotating speeds of the fan 128 or/and the pump 122 according to the operating temperatures of the cooling liquid 129 and the working temperature of the computing unit 222 (step S325) to enhance thermal dissipating ability of the thermal dissipating device 1. After that, back to step S312 and step S314 to implement cooling monitoring procedure.

Figure 5:
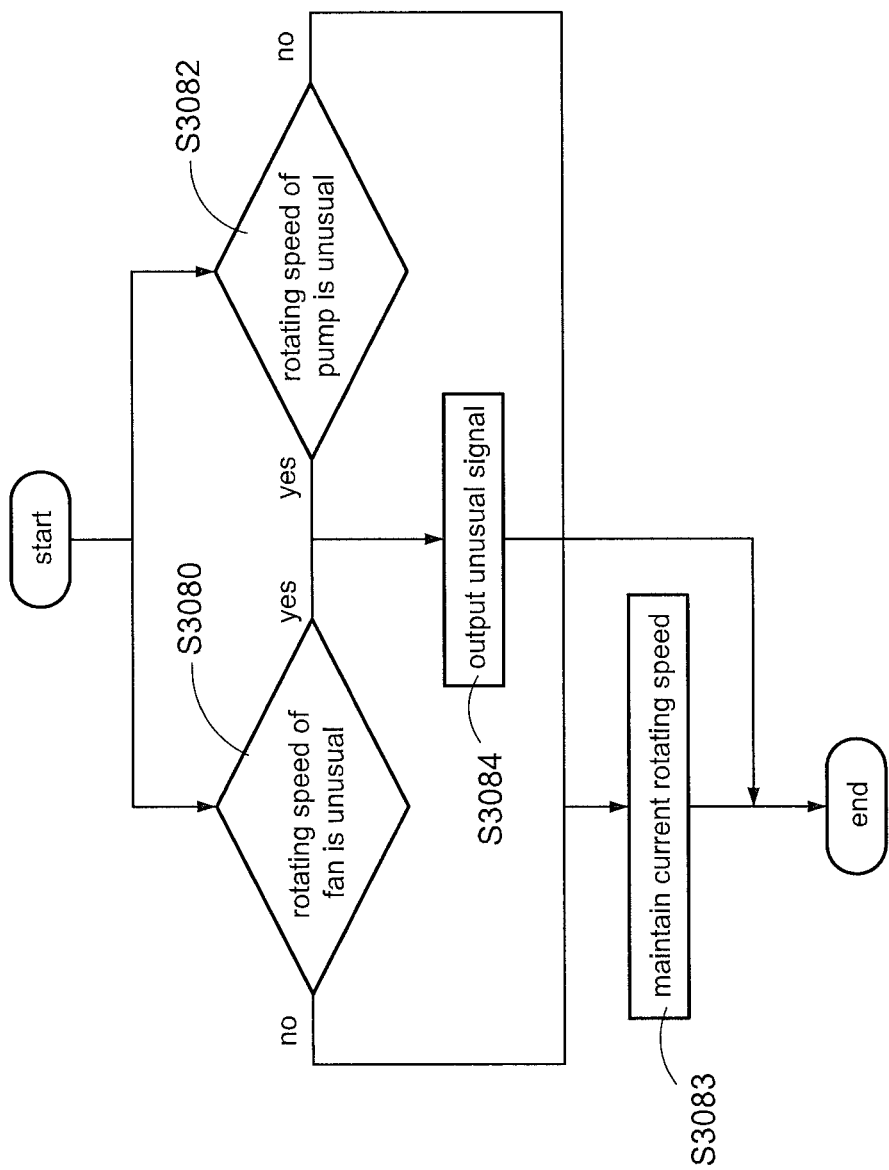
FIG. 5 is a flowchart showing steps for a self-condition inspection according to the present disclosure.

Reference is made to FIG. 5, which is a flowchart showing steps for a self-condition inspection according to the present disclosure. The self-condition inspection of step S308 includes steps shown in FIG. 4. At first, the fan controller 144 senses whether a rotating speed of the fan 128 is unusual (step S3080), and the pump controller 146 senses whether a rotating speed of the pump 122 is unusual (step S3082).

When the rotating speed of the fan 128 sensed by the fan controller 144 is unusual, a fan speed abnormal signal is outputted from the fan controller 144 and transmitted to the microprocessor 142 (step S3084). The fan speed abnormal signal includes an unusual information of the fan 128 and current rotating speed of the fan 128. The fan speed abnormal signal is transmitted to the computing module 22 via the cable 13 by the microprocessor 142, and may be shown on the displaying unit 26. When the rotating speed of the fan 128 sensed by the fan controller 144 is usual, the rotating speed of the fan 128 is maintained (step S3083).

After step S3082, when the rotating speed of the pump 122 sensed by the pump controller 146 is unusual, a pump speed abnormal signal is outputted from the pump controller 146 and transmitted to the microprocessor 142 (step S3084). The pump speed abnormal signal includes an unusual information of the pump 122 and current rotating speed of the pump 122. The pump speed abnormal signal is transmitted to the computing module 22 via the cable 13 by the microprocessor 142, and may be shown on the displaying unit 26 controlled by the computing module 22. When the rotating speed of the pump 122 sensed by the pump controller 146 is usual, and the rotating speed of the pump 122 is maintained (step S3083).

In the present disclosure, the cable 13 includes the USB connector, such that a function of plug and play is provided, and is convenient to use. Moreover, the self-condition inspecting procedure of the thermal dissipating method is prior implement after the electronic device 2 implementing the booting procedure and electricity correcting procedure, such that the damage of the electronic device 2 causes by unusual thermal dissipating device 1 is prevented. Furthermore, the cooling monitoring procedure is implemented after the booting procedure of the electronic device 2 is finished, warning the user when the operating temperature of the computing unit 222 and the cooling liquid 129 is over-heat, and forcing to shut down the electronic device 2 when the rotating speeds of the fan 128 and the pump 122 exceed the ranges of the normal speeds respectively, such that the safety of usage is enhanced.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the disclosure as defined in the appended claims.

What is claimed is:

1. A water-cooling thermal dissipating system, comprising:
   an electronic device, comprising:
   a computing module comprising a computing unit releasing heat;
   a power supply unit electrically connected to the computing module and configured to supply an electricity to the computing module; and
   a display unit electrically connected to the computing module;
   a thermal dissipating device, comprising:
   a thermal conductive unit disposed corresponding to the computing unit, wherein the computing unit is attached to an external surface of the thermal conductive unit for thermal conduction;
   a pump coupled to the thermal conductive unit for pumping a cooling-liquid into the thermal conductive unit;
   a tank coupled to the pump, wherein the cooling-liquid is stored in the tank;
   a thermal exchanger coupled to the thermal conductive unit and the tank, wherein the cooling liquid is allowed to flow into the thermal conductive unit for absorbing heat produced by the computing unit, and the thermal exchanger then thermally transfers heat within the cooling liquid to an environment external to the thermal exchanger for dispersing heat;
   a controlling module configured to sense a working state and control heat dissipation efficiency of the thermal dissipating device;
   a cable connected to the computing module and the controlling module, wherein the computing module and the controlling module are electrically connected to each other through the cable so that the electricity generated by the power supply unit is conducted to the controlling module for powering the controlling module;
   a first pipe directly connected between the thermal conductive unit and the thermal exchanger;
   a second pipe directly connected between the thermal exchanger and the tank;
   a third pipe directly connected between the tank and the pump; and
   a fourth pipe directly connected between the pump and the thermal conductive unit,
   wherein the pump is configured to force the cooling liquid to flow within the first pipe, the second pipe, the third pipe and the fourth pipe;
   wherein an abnormal signal is generated and sent to the computing module through the cable by the controlling module when the thermal dissipating device is sensed to be in an abnormal state by the controlling module, and the computing module then makes the display unit show alarm information and forces to shut down the electronic device after continually receiving the abnormal signal for a predetermined time.

2. The water-cooling thermal dissipating system in claim 1, wherein the abnormal signal is generated when a pump speed is not within a range of a normal speed.

3. The water-cooling thermal dissipating system in claim 1, wherein the abnormal signal is generated when a level of the cooling liquid is sensed as a low liquid level.

4. The water-cooling thermal dissipating system in claim 1, wherein the controlling module further generates a warning signal when an operating temperature of the cooling liquid is over-heat.

5. The water-cooling thermal dissipating system in claim 1, wherein the controlling module further generates a warning signal when a working temperature of the computing unit is over-heat.

6. The water-cooling thermal dissipating system in claim 5, wherein the computing module makes the display unit show warning information when the computing module receives the warning signal.

7. The water-cooling thermal dissipating system in claim 1, wherein the thermal dissipating device further comprises a fan placed at the thermal exchanger to provide an air flow in the thermal exchanger for rapidly dissipating heat to the environment external to the thermal exchanger.

8. The water-cooling thermal dissipating system in claim 7, wherein the abnormal signal is generated when a fan speed is not within a range of another normal speed.

9. The water-cooling thermal dissipating system in claim 7, wherein the controlling module comprising:
a microprocessor electrically connected to the computing module through the cable;
a fan controller electrically connected to the microprocessor and the fan, wherein the fan controller is configured to control and sense the fan speed;
a pump controller electrically connected to the microprocessor and the pump, wherein the pump controller is configured to control and sense pump speed;
a cooling liquid sensor disposed within the tank and electrically connected to the microprocessor for sensing an operating temperature of the cooling liquid; and
a thermal sensor disposed near the thermal conductive unit and electrically connected to the microprocessor, wherein the thermal conductor for sensing a working temperature of the thermal conductive unit.

10. The water-cooling thermal dissipating system in claim 9, wherein the thermal sensor is attached to an internal surface of the thermal conductive unit in contact with the computing unit.

11. The water-cooling thermal dissipating system in claim 1, wherein the power supply further supplies the electricity to the display unit directly.

12. The water-cooling thermal dissipating system in claim 1, wherein the power supply unit further supplies the electricity to the display unit through the computing module.

13. The water-cooling thermal dissipating system in claim 1, wherein the cable is a universal series bus (USB) cable having a USB connector connected with a USB port of the electronic device.

* * * * *